US007253012B2

(12) United States Patent
Kerr et al.

(10) Patent No.: US 7,253,012 B2
(45) Date of Patent: Aug. 7, 2007

(54) GUARD RING FOR IMPROVED MATCHING

(75) Inventors: Daniel Charles Kerr, Orlando, FL (US); Roscoe T. Luce, Kissimmee, FL (US); Michele Marie Jamison, Sanford, FL (US); Alan Sangone Chen, Windermere, FL (US); William A. Russell, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 324 days.

(21) Appl. No.: 10/941,665

(22) Filed: Sep. 14, 2004

(65) Prior Publication Data

US 2006/0057840 A1 Mar. 16, 2006

(51) Int. Cl.
*H01L 21/00* (2006.01)

(52) U.S. Cl. .................. 438/22; 438/160; 438/942; 438/947; 438/950; 257/E21.24; 257/E21.259

(58) Field of Classification Search ............ 438/22, 438/160, 942, 947, 950; 257/E21.24, E21.259
See application file for complete search history.

(56) References Cited

U.S. PATENT DOCUMENTS 5,965,925 A    10/1999   Kornachuk et al.

6,646,509 B2    11/2003   Sobel
2003/0228714 A1   12/2003   Smith et al.
2005/0189612 A1 *  9/2005   Hung et al. ............. 257/529

FOREIGN PATENT DOCUMENTS

JP         59-161834 A1 *  9/1984

OTHER PUBLICATIONS

H.P.Tuinhout, Design Of Matching Test Structures, IEEE 1994, vol. 7, Mar. 1994, pp. 21-23.

* cited by examiner

*Primary Examiner*—Matthew Smith
*Assistant Examiner*—Thanh V. Pham

(57) ABSTRACT

A semiconductor manufacturing method comprises forming a leveling guard ring defining an interior area into which are fabricated one or more devices. In certain aspects, two or more matched devices, such as in a common centroid layout, are fabricated in the interior area. The guard ring is formed on at least one particular layer for a particular processing step. By the guard ring overwhelming the effect of local features' elevation differences, photoresist thereafter applied consequently has a more uniform height across the interior area, resulting in more uniform devices. A plurality of guard rings may be used that enclose respective arrays of matched devices arranged over the surface of a semiconductor wafer. Based on the equalizing effect by each of the guard rings, the respective devices arranged in the interior areas are more evenly matched to equivalent devices in far-spaced guard rings. Thus, local and global matching are achieved.

3 Claims, 7 Drawing Sheets

GUARD RING FOR IMPROVED MATCHING

FIELD OF THE INVENTION

This invention relates in general to the field of semiconductor manufacturing. More particularly, this invention relates to methods and systems for feature design on a semiconductor wafer surface that provides local and global matching.

BACKGROUND OF THE INVENTION

Photolithography is one of the most frequently employed semiconductor wafer processing techniques used to manufacture integrated circuits (IC's). Photolithography comprises a process for forming a pattern (i.e., via photographic transfer) of complex circuit structures onto a semiconductor wafer surface for patterning. These patterns are defined on the wafer in a succession of exposure and processing steps to form a number of superimposed layers. Manufacturing processes for IC devices depend upon extremely accurate reproduction of these patterns onto the wafer surface in order to produce uniform features. A certain accuracy and precision in forming features by photolithography is necessary for proper performance matching of certain features at a local and at a global (i.e., chip) level. The importance of the accuracy and precision increases with decreasing feature size, to which the industry is trending.

During each photolithographic step, unintended deviations are commonly introduced that distort the photomask image being transferred onto the chip areas of a wafer surface. These deviations depend on the characteristics of a pattern being transferred, the topographic elevation of the chip areas, and a variety of other processing parameters. Processing deviations adversely affect the performance of a semiconductor device. In particular, when a layer of photoresist is deposited on a wafer surface, such as by spin coating, the uniformity of the photoresist layer thickness is known to be distorted by the density and arrangement of the features that contribute to the topographic elevation of the chip areas. For instance, where the local features in one region are relatively dense and the features in an adjacent region are relatively less dense, the top surface of the layer of photoresist frequently slopes downward from the former to the latter. Further, the photoresist thickness may vary irregularly around various densities and arrangements of features. Thus, a patterning of a number of similar features, such as resistors, in a region of sloping or irregular photoresist thickness may result in unequal dimensions and performance of such features. For example, due to the effects of different densities, shapes and/or heights of "upstream" features (i.e., toward the source of photoresist), photoresist thickness will vary for each of the two purportedly matched resistors. Then, one resistor may have an overall wider conductor linewidth while the other purportedly matched resistor has a narrower overall linewidth. This will result in unequal performance of the two purportedly matched resistors (i.e., local mismatching of devices).

In view of this example and more generally, the photolithographic process of forming patterns and features on a wafer is sensitive to the wafer topographic elevation. Existing differences in topographic elevation, prior to deposition of photoresist, can result in a variation in photoresist thickness over a relatively long (but still local) distance. Such a photoresist thickness change induces a linewidth or other change from the specification for a given pattern. This change from specification results in performance differences from specification, and such differences are manifested when multiple devices are being formed in an area that includes the photoresist thickness change. This results in local mismatching of devices. The following publication, which is incorporated by reference herein, describes a number of sources of mismatches in addition to such topography-related phenomenon, "Design of Matching Test Structures," H. P. Tuinhout, Proc. IEEE 1994 Int'l. Conference on Microelectronic Test Structures, Vol. 7, page 21-23, March 1994.

Those skilled in the art have addressed variation in photoresist thickness due to flow over irregular chip topography. A customary approach to reduce or eliminate the impact of gradual photoresist thickness change, and other factors, over a relatively small spatial dimension is to arrange the devices in a common centroid layout, particularly with interdigitated fingers with dummies. A centroid is defined generally as the center of mass. A common centroid arrangement of two devices, for example, occurs when the features of the respective devices are arranged such that both devices have the same center of mass. Often in chip design an array of multiple similar segments (i.e., fingers) comprise one device, and this is arranged in a particular pattern with a second similarly comprised device in a pattern by which both devices have the same centroid (i.e., a common centroid).

A common centroid layout may be one-dimensional or two-dimensional. A one-dimensional common centroid layout provides identical matched devices arranged to form a symmetrical pattern of their respective segments such that the so-arranged devices share a common axis of symmetry. For instance, FIG. 1a depicts matched devices A and B arranged with segments ABBA, where there is a common axis of symmetry 10 between the two B segments. These devices also share a central, common centroid, designated by the "X" in the center of the common axis of symmetry 10. Typically, since the two A segments are on the exterior, leveling segments are added in order for each segment to be next to a similar arrangement of geometries (thereby addressing iso-nested bias). Another one-dimensional common centroid pattern is depicted as ABABAB. Here, one A and one B segment comprise the end segments. A two-dimensional common centroid layout derives both of its axes from its interdigitating pattern. Examples are depicted in FIGS. 1b and 1c.

However, devices in common centroid layouts are nonetheless subject to linewidth variation caused by photoresist thickness variations. Such thickness variations may be caused by variation due to an uneven flow over and other effects from local features that come to lie underneath the photoresist layer (i.e., "underlying features"). Further, problems with global matching, that is, the performance equivalence of devices (or arrays of devices) spaced a distance from one another on an integrated circuit, may result when there is different local topographic elevation near, for instance, two relatively distant devices (or arrays of devices) that are designed to have matched performance. The importance of the symmetry and precision of matched devices, to provide acceptable performance, is recognized for many device types, such as, but not limited to, resistors, capacitors, and transistors.

As to the presence of multiple relatively nearby features that may affect photoresist thickness in an area later used for matched devices, present designs result in a random and complex effect of such nearby underlying features. This is better understood in consideration of how photoresist is applied. Typically photoresist is applied over a wafer that is spinning, such as between 1,000 and 8,000 revolutions per minute. Based on the sum effects of the particular composition of the photoresist and viscosity, the spin speed, and the temperature, and other factors, the thickness of the photoresist layer across the wafer surface tends to a particular fixed value. Across a relatively uniform area of the wafer, such as a large block of thick polysilicon, where there are no nearby raised features between the area and the point of application of the photoresist, the photoresist thickness tends toward this fixed value. This may be considered to be the "flat-wafer equilibrium thickness."

It is noted that the thicknesses typical of photoresist layers applied to IC wafers are relatively thin, in an order of magnitude of about 1.0 micron. It is appreciated that physical/chemical effects, such as surface tension, charge effects and interactions, and general Theological properties at this thinness of photoresist may cause the photoresist thickness to behave in ways not expected based on the behavior of relatively thicker layers. In view of this particular environment, the present invention provides advances in the art.

More particularly, the leveling guard ring technology as described and claimed herein addresses a need for improvements in topographic elevation and device layout to better ensure improved local and/or global matching. This becomes increasingly important as size requirements for features becomes increasingly smaller, and given the variable design arrangements in which one or more relatively nearby underlying features may crucially distort a photoresist layer thickness.

SUMMARY OF THE INVENTION

Among the several independent and separate objects of the present invention may be noted streamlining the semiconductor manufacturing processes, increasing product yield rates, solving the need for greater accuracy and/or precision, and improving process accuracy and/or precision by designing and implementing a topographic elevation that comprises a guard ring structure surrounding an area in which one or more devices is/are arranged, such as matched devices arranged in a common centroid pattern.

In one embodiment of the present invention, a leveling guard ring is formed around an area in which an array of devices is fabricated in a common centroid layout. In another embodiment, a leveling guard ring is formed around an area in which one or more devices that are fabricated therein are arranged in a layout other than a common centroid layout.

In another embodiment of the present invention, two or more leveling guard rings spaced apart on a semiconductor chip each contain an array of devices in a common centroid layout. Devices within one such spaced-apart guard ring are functionally matched to one or more devices within another such spaced apart guard ring. Given the increase in relative uniformity of photoresist thickness that the guard rings provide for their respective interiorly located device arrays, greater performance uniformity, or matching, is achieved for these matched devices.

More generally, the present invention relates to determining an appropriate location for, and forming, a guard ring structure defining an interior area. Whether formed by one or more layers, the guard ring of the present invention has a height sufficient to impose an effect on flow of photoresist thereafter applied, and photoresist thereafter applied consequently has a more uniform height across the interior area. After the photoresist is applied, a photolithography process forms or completes features of devices in the interior area with the more uniformly thick photoresist. Linewidths of trenches and other features formed in such more uniform photoresist are consequently more uniform. Also, in certain embodiments matched devices in the interior area are arranged in a common centroid arrangement, so that any non-uniformity of photoresist thickness, and other factors, as may occur, are distributed relatively evenly to all such matched devices.

Further, in certain embodiments one or more guard rings enclosing respective arrays of matched devices are arranged across the surface of a chip, spaced apart so as to be not local to one another. Based on the equalizing effect of each of the guard rings, the respective devices arranged in the interior areas are more evenly matched to equivalent devices in far-spaced guard rings. Thus, both local and global matching are achieved by practicing the methods and systems of the present invention.

Other aspects, advantages and objects of the present invention are provided in the following description, which is to be considered with the appended drawings.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION OF THE INVENTION

The leveling guard ring technology of the present invention provides for formation of guard rings that surround areas in which the leveling effect of the guard ring provides for more uniform photoresist thickness. A guard ring of the present invention typically is formed during the formation of other features on the chips of a wafer. While a guard ring may be formed of only one or two layers, it also may be formed of multiple layers. While any of the fabrication techniques normally used in IC manufacture may be employed to form leveling guard rings, a common technique is noted. Namely, layering is followed by etching, thereby leaving the desired features at essentially uniform height, including the guard rings and other features on the chip surface.

A guard ring of the present invention may be referred to as a "leveling guard ring." As used throughout the specification, a "leveling guard ring" also is referred to as a "guard ring" or a "guard ring of the present invention."

The present invention lessens or eliminates the undesired effect of certain wafer topographic elevation on photoresist thickness in an area defined by a guard ring of the present invention. In certain embodiments, a guard ring of the present invention is formed around an area in which thereafter are fabricated an array of devices in a common centroid layout. The guard ring so formed enforces symmetry on the photoresist flow so that the photoresist thickness within the guard ring is controlled and made more uniform compared to the influence of numerous local underlying features, which, owing to their various densities and/or shapes near the area of interest (that area being within the guard ring), is expected to exert an undesirable variation on photoresist thickness in that area.

A more uniform photoresist thickness, as used herein, takes into account that there may be a transition zone of changing thickness near a wall of the leveling guard ring. That is, adjacent to and within the "upstream" guard ring wall (that is, the wall closest to the source of the photoresist during spin coating), the height of the photoresist is expected to be thicker than the 'flat-wafer equilibrium thickness' as defined herein. Further inward interior in the area, the photoresist thickness may slope gradually toward or to the 'flat-wafer equilibrium thickness.' This leads to a design criterion, in certain embodiments, to position the features within the guard ring relatively close to the guard ring walls. These relatively closer features are subject to a photoresist thickness that is more predictably affected by the guard ring.

Figure 1A:
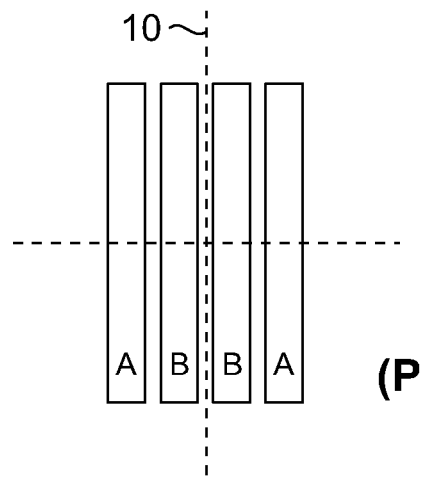
FIGS. 1a, 1b, and 1c depict arrangements of features in common centroid designs as is known in the art.
Figure 1B:
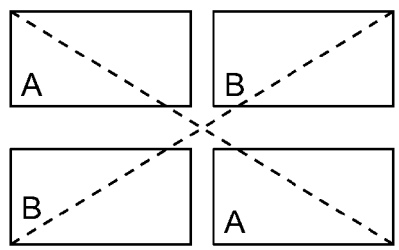
Figure 1C:
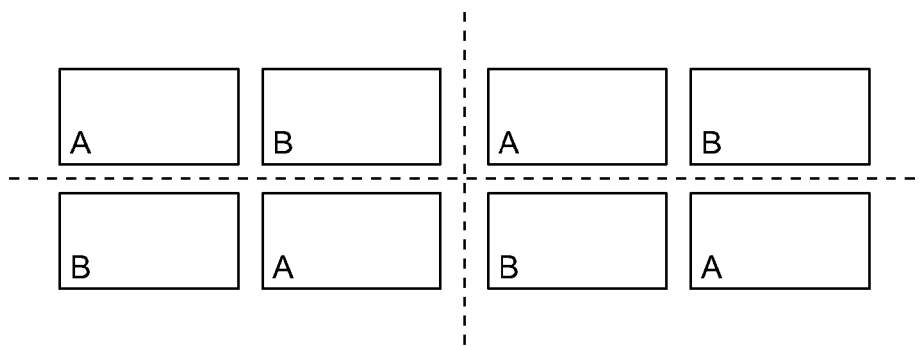
Figure 2A:
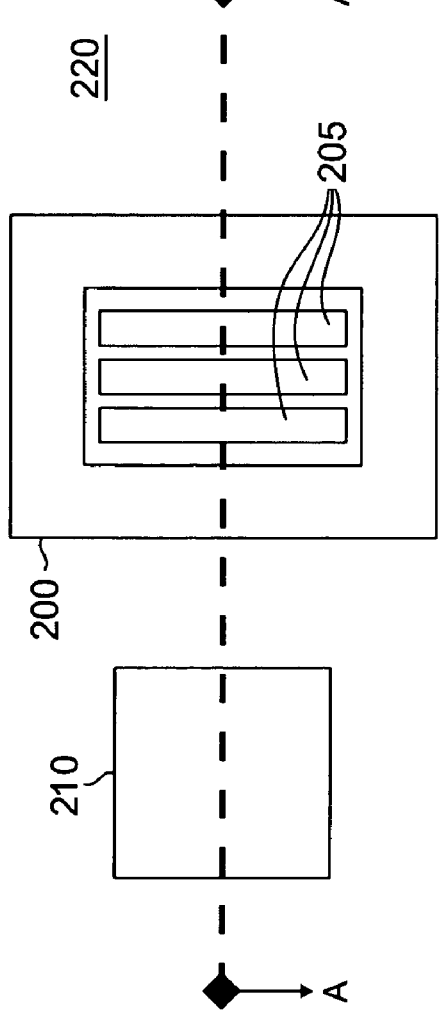
FIG. 2a provides a plan view of a guard ring of the present invention in a close relationship with a feature upstream of it.
Figure 2B:
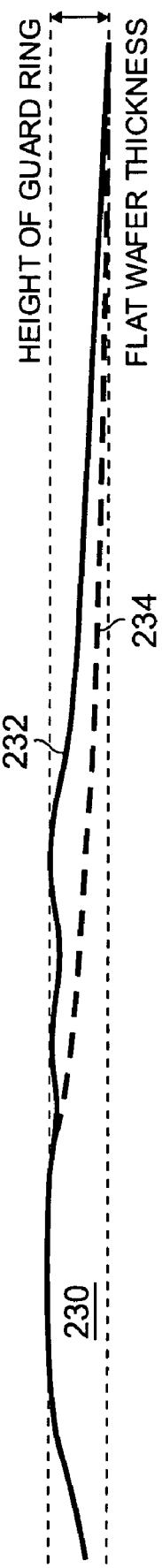
FIG. 2b provides a graphic comparison of the relative height and top surface of a photoresist layer with and without a guard ring present.
Figure 2C:
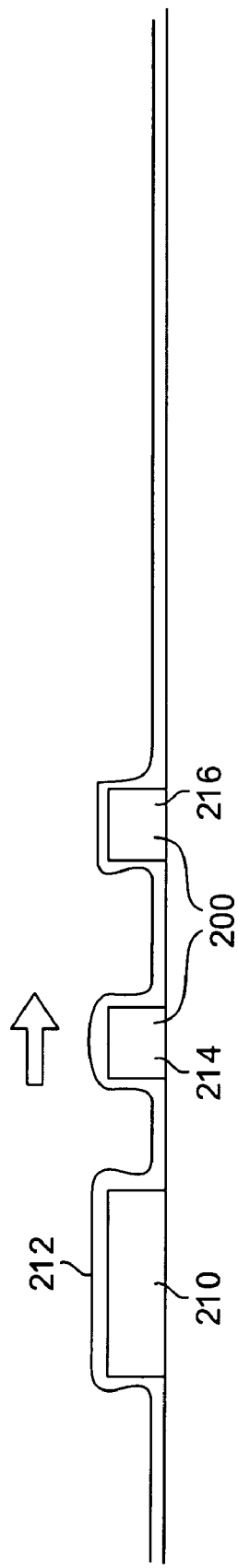
FIG. 2c provides a cross section view corresponding to FIG. 2a, having a guard ring of the present invention in a close relationship with a feature upstream of it.

For example. FIG. 2a provides a plan view of a guard ring 200 of the present invention, enclosing planned features 205, in a close relationship with a feature 210 upstream of it (in relationship to the flow of photoresist) on a semiconductor wafer surface 220 during fabrication. FIG. 2b provides a graphic comparison of the relative height and top surface of a photoresist layer 230 with and without a guard ring present The photoresist too surface 232 with guard ring is shown as a solid line, and the expected photoresist top surface 234 when a guard ring is not present is shown as a dotted line. FIG. 2c provides a cross section view taken along axis A-A' of FIG. 2a, depicting the cross-sectional profiles of the guard ring 200 of the present invention and the feature 210 upstream of it. It is noted that planned features 205 that are depicted in FIG. 2a within guard ring 200 are designed but not yet fabricated, and thus are not shown in FIG. 2c.

FIG. 2c indicates a second layer 212 that is to be patterned on over the existing feature 210 and the guard ring upstream wall 214 and downstream wall 216. An arrow indicates the direction of flow of the photoresist that will be used to image features on second layer 212. As indicated in the comparison in FIG. 2b, due to guard ring 200 the photoresist top surface 232 is higher and more uniform between guard ring upstream wall 214 and guard ring downstream wall 216 compared with 234 (if there were no guard ring 200). This consequently more uniform photoresist thickness (compared to 234) within guard ring 200 results in improvement of consistency of features to be made within the guard ring 200 during the photolithographic process that utilizes the photoresist 230 shown in FIG. 2c (i.e. for second layer 212).

Thus, it is appreciated that although some variation in photoresist thickness may still exist within the confines of the area within a guard ring of the present invention, the variation inside the guard ring wails is controlled and improved by the uniform effect of the guard ring walls rather than numerous local features of different densities and spacing that underlie the photoresist. Particularly, in certain embodiments, an "upstream" wall is close to an opposing "downstream" wall, so that the distance between these walls is less than the relaxation length (i.e., the distance to reach photoresist flat-wafer equilibrium thickness). For example, the wall-to-wall-to-wall-to-wall distance may be about 15 micrometers, or alternatively may be up to about 25 micrometers, when the relaxation length is about 50 micrometers. Further, even though the photoresist thickness does change inside the guard ring, the photoresist thickness profile over distance is symmetrical and deviations imparted by this thickness variation are cancelled out in certain embodiments by use of the common centroid design, particularly with an interdigitated layout. Thus, the use of the present invention leveling guard ring overcomes a disadvantage of using common centroid layout alone, because the guard ring layout is substantially insensitive to the topographic elevation outside the guard ring (i.e., the guard ring perturbation overrides the individual and varied perturbations of the local features).

More particularly, guard rings of the present invention have a height relative to surrounding features, and a footprint and shape, such that the placement of the guard ring reduces or eliminates the effect of surrounding features' elevations on uniformity of photoresist thickness within the guard ring. As noted, the height of the guard ring may be achieved by forming the guard ring in one layer, in two layers, or in a larger number of layers. Without being bound to a particular theory, a more uniform photoresist thickness is achieved when the effects of the local adjacent uneven underlying features are lessened or eliminated as the photoresist flows over (i.e., at one guard ring wall), and is retained by (i.e., at the opposite wall) the guard ring structure.

As used herein, a local effect, as from elevated features, is taken to mean 200 microns, while guard rings that are placed 200 microns or more apart are considered to be independent of the influence of one another, i.e., are nonlocal but instead are related globally.

Thus, use of the guard rings of the present invention are intended to provide for more precise and more accurate results during subsequent photolithography. It is appreciated that photolithography is one of a number of crucial processes performed in semiconductor manufacturing. As semiconductive materials are staged through these processes, it is essential to accurately perform photolithography since it determines device dimensions directly affecting quality, production yield, and manufacturing cost. Photolithography is also a critical process because it is iterated in a succession of exposure/processing steps to form a number of superimposed layers of insulators, conductors, and semiconductor materials.

Photolithographic processing most often occurs on a plurality or "lot" of wafers, which are fabricated as a batch. A representative photolithographic processing includes the following steps:

Each wafer has photoresist material applied to its surface, such as by spin coating;

Wafers are exposed to an energy source such as an ultraviolet light with a mask, exposing the photoresist to create a desired pattern on the photoresist;

Photoresist is developed by applying a developer solution;

Patterns (i.e., images) are stabilized by an appropriate lithography or fixing method;

Each wafer is etched; and

Remaining photoresist later is removed.

Photoresist materials may be selected from positive or negative photoresist chemicals. These broad classes of optical-type resists are described in "Microchip Fabrication," $3^{rd}$ Edition by Peter Van Zant 1997, McGraw Hill ("Zant reference"). These teachings and other teachings as to specific fabrication steps as referred to herein, including the above-summarized photolithography steps, are particularly incorporated by reference. More generally, all patents, patent applications, patent publications, and all other publications cited herein are incorporated by reference to the same extent as if each individual publication or patent application was specifically and individually set forth in its entirety.

As discussed above, during photolithographic processing unintended deviations from various sources may be introduced that distort a photomask image that is being transferred to a chip surface to form part of a patterned circuit. That is, images to form a patterned circuit deviate from the original dimension and shape of a photomask image. Some of these deviations are the result of thickness differences in the photoresist. As discussed, one source of such photoresist thickness differences is the sloping of the photoresist surface as a result of flowing from an area of more dense elevated features to an area of no or less dense elevated features. When there are dense and/or numerous elevated features, particularly "upstream" of an area where matched devices are to be fabricated (i.e., between the area and the source of the photoresist during its application), these features may impart perturbations in the flow and ultimate thickness of the photoresist that persist across the area for the matched devices. This non-uniform effect of photoresist thickness results in non-uniform device features that may lead to poor matching of the devices in the area.

Figure 2D:
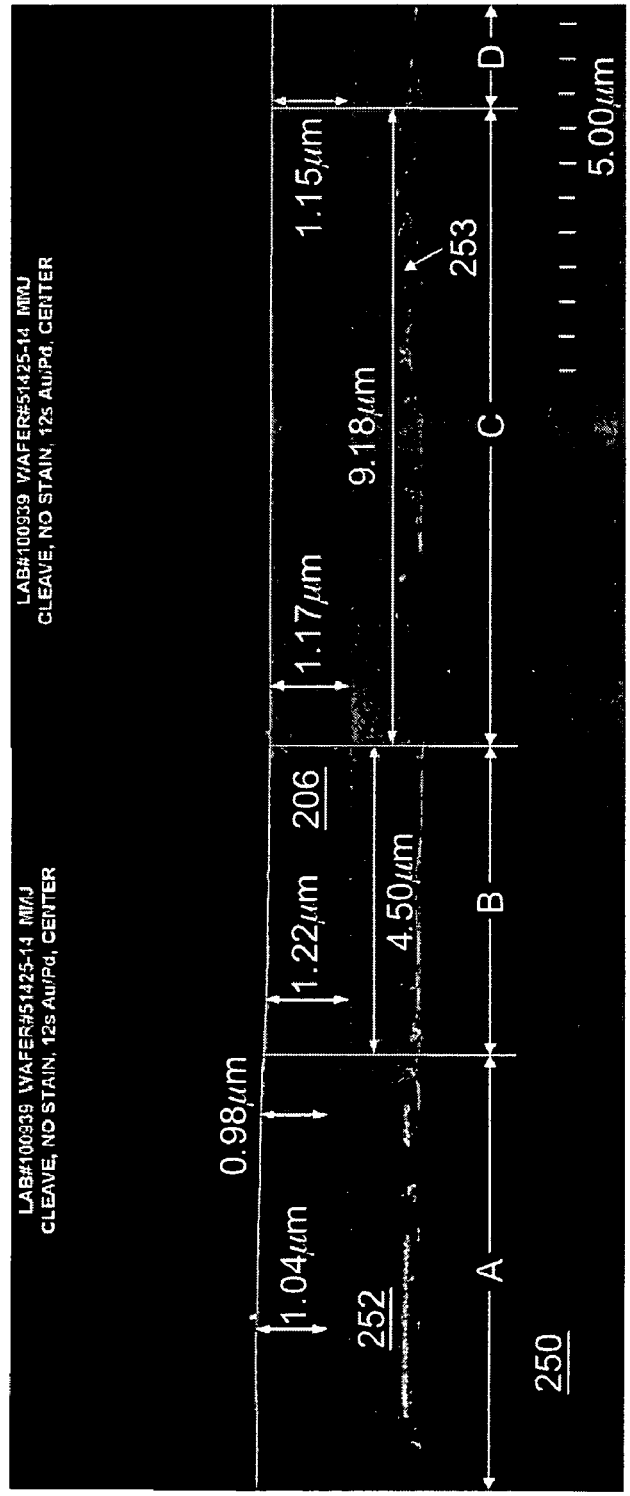
FIG. 2d is a crass-section scanning electron micrograph of a section of wafer during fabrication, showing the influence of underlying polysilicon on thickness of overlain photoresist.

FIG. 2d provides an example of photoresist thickness deviation on a wafer surface. FIG. 2d is a cross-section scanning electron micrograph of a section 250 of a wafer during fabrication. A polysilicon (i.e., polycrystalline silicon) feature 252, in region A, is more elevated than a nearby region B, and a local region C which comprises a resistor layer 253. As the photoresist 206 was applied over feature 252, the photoresist 256 was perturbed upwardly over feature 252. The surface 258 of photoresist 256 is less high elsewhere in FIG. 2d, and moving toward the right of FIG. 2d there is a gradual lessening of total height from the region above feature 252. Importantly for the masking and patterning of the photoresist 256, the thickness of photoresist 256 varies with distance from the region above feature 252.

For example, at one point in region B the photoresist thickness is measured as 1.22 micrometers, at one point in region C the photoresist thickness is measured as 1.17 micrometers, and at one point in region D, the farthest measured point from elevated prior feature 202, the photoresist thickness is measured as 1.15 micrometers. Such thickness variation causes linewidth variation and/or other deviations in patterned devices, such as resistors, that are to be fabricated in a region such as region C.

As used herein, including the claims, by guard ring is meant that the guard ring is formed during formation of at least one particular layer, and is located and fabricated for the purpose of causing a photoresist layer to be more uniformly distributed within an area surrounded by the guard ring. The footprint, height, and overall shape of a guard ring of the present invention are such that a subsequently applied photoresist layer obtains more uniform thickness in the area within the guard ring. This is the case even when the height of the guard ring is substantially less than the final thickness of the photoresist layer. For example, not to be limiting, a guard ring height of about thirty percent of the photoresist average height, may be effective at providing more uniform photoresist thickness within its boundaries. This height has a desired effect when it is substantially equal to the height of photoresist-flow-disturbing components on the patterned circuit (i.e., adjacent underlying features that would otherwise perturb the photoresist flow in individual and varying manners).

More generally, it is appreciated that features fabricated in prior process steps, that are near an area of interest in which uniformity is desired, may affect that area, arid that a guard ring of the present invention may overcome this undesired effect For example, in a prior process step a first polysilicon layer is deposited over an oxide layer. Then this first polysilicon layer is patterned, leaving features in accordance with the circuit design. These features in particular affect the photoresist thickness of a subsequently applied photoresist layer. In a later step when a second polysilicon layer is deposited, it will deposit over the features of the first polysilicon layer. This results in irregularity (i.e., greater height) of the second polysilicon layer over and around the first layer polysilicon features. Then, when the second polysilicon layer is patterned, this irregularity may adversely affect the precision and accuracy of features patterned near the first layer polysilicon features.

Figure 3A:
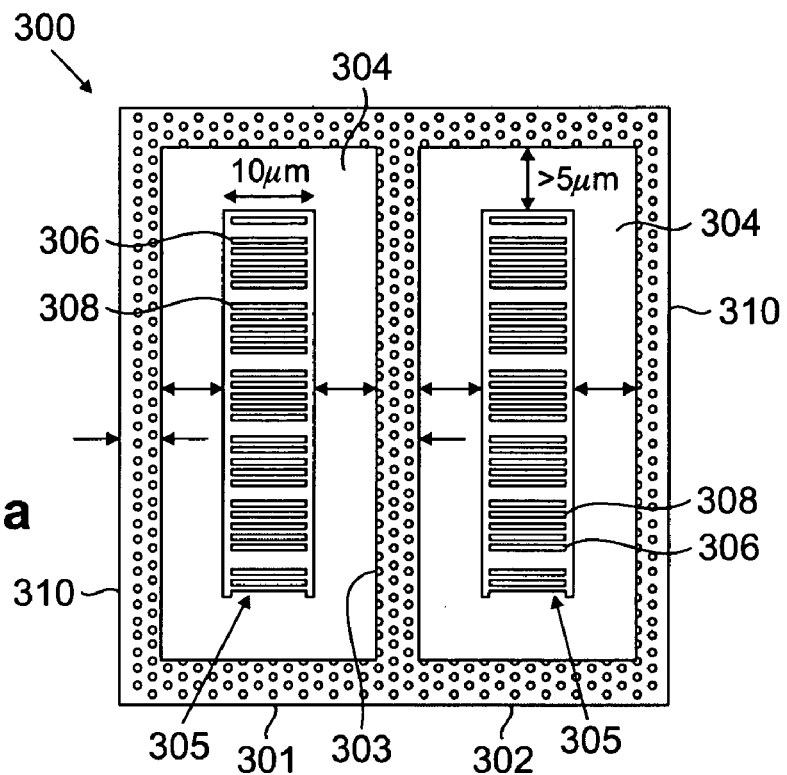
FIG. 3a provides a two-dimensional diagram of a leveling guard ring layout style with two adjacent leveling guard rings, each having within its boundary two centrally disposed arrays of matched devices.

FIG. 3a provides a two-dimensional diagram of one embodiment of a guard ring layout style 300 comprising two adjacent guard rings 301 and 302 sharing a common wall 303. Within the boundary of each guard ring 301 and 302 is an internalized area 304, in which are formed a centrally disposed array 305 of patterned circuit matched devices 306 and 308. Each set or army 305 of matched devices 306 and 308 is arranged in a common centroid layout. While not being bound to particular dimensions and dimensional relationships, the embodiment depicted in FIG. 3 has walls 310 of the guard rings 301 and 302 of 5 micrometers width, and an array width of 10 micrometers.

Figure 3B:
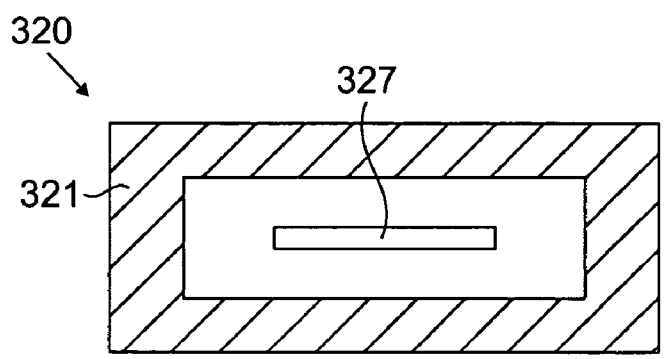
FIG. 3b provides a two-dimensional diagram of a leveling guard ring layout style with one device contained within it.
Figure 3C:
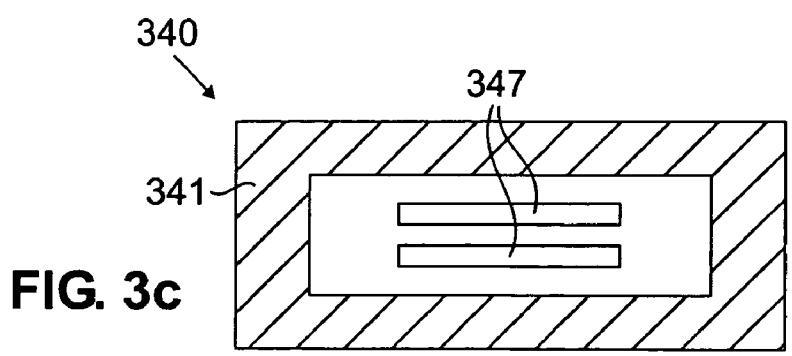
FIG. 3c provides a two-dimensional diagram of a leveling guard ring layout style with two devices arranged side-by-side within it.
Figure 3D:
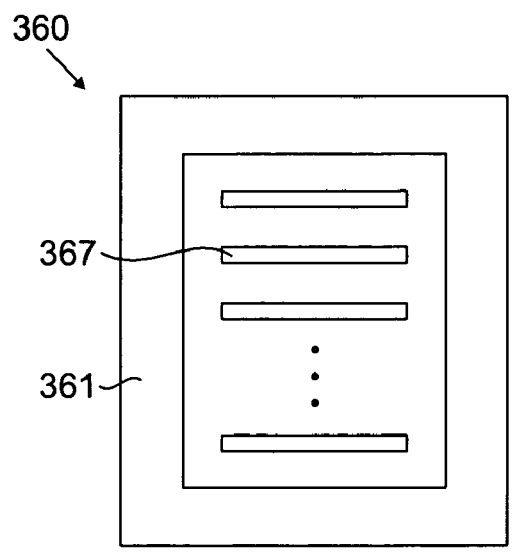
FIG. 3d provides a two-dimensional diagram of a leveling guard ring layout style with a plurality of devices arranged side-by-side within it.
Figure 3E:
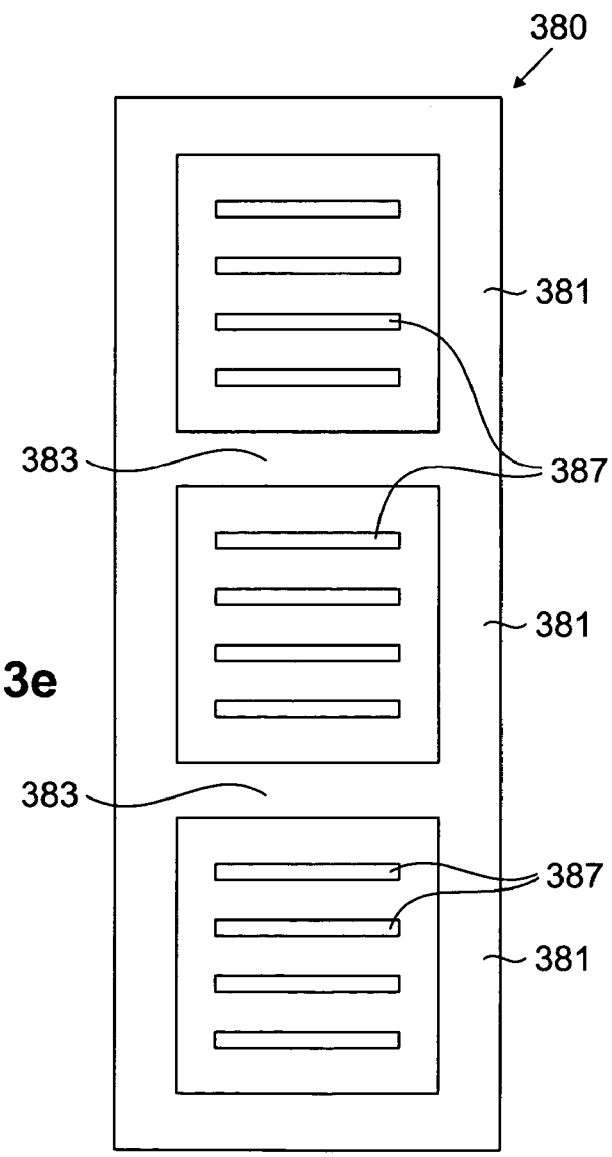
FIG. 3e provides a two-dimensional diagram of a leveling guard ring layout style with three adjacent leveling guard ring enclosures, each having within its boundary five devices arranged side-by-side.

FIG. 3b provides a two-dimensional diagram of a leveling guard ring layout style 320 comprising a leveling guard ring 321 with one device 327 contained within it. The device depicted is a single device rather than an interdigitating configuration of two or more devices. For instance, the single device may be any electrical circuit component configured appropriately to meet a particular predetermined electrical component characteristic. FIG. 3c provides a two-dimensional diagram of a leveling guard ring layout style 340 comprising a leveling guard ring 341 with two devices 347 arranged side-by-side within it. FIG. 3d provides a two-dimensional diagram of a leveling guard ring layout style 360 comprising a leveling guard ring 361 with a plurality of devices 367 arranged side-by-side within it. FIG. 3e provides a two-dimensional diagram of a leveling guard ring layout style 380 with three adjacent leveling guard ring enclosures 381, having common walls 383, each leveling guard ring enclosure 381 having within its boundary four devices 387 arranged side-by-side. It is appreciated that each device depicted in these figures, instead of being a single device, may alternatively be an array of two or more devices, such as (but not limited to) two devices in an interdigitated pattern (as shown in FIG. 3a). Alternatively, each of the arrays of multiple devices, such as depicted in FIGS. 3d and 3e, may be components of arrays of devices arranged in a common centroid pattern.

The topography as depicted in FIG. 3a-e is the result of several basic steps which are generally described as follows. These steps are well known in the art, and are more fully described in the Zant reference, chapters 5-13, which are specifically incorporated by reference for process step details disclosing the state of the art. During the series of steps in the manufacture of integrated circuits on a semiconductor wafer, a layering operation provides a layer of an insulator, a semiconductor, such as polysilicon, or a conductor. Such layering may be achieved by growing (i.e., oxidation), by deposition (i.e., chemical vapor deposition), by evaporation, by sputtering, or by any later-developed technology. When appropriate based on the layering method and material, a patterning operation then patterns a desired number of guard rings such as shown in FIG. 3. As discussed, typically during such patterning sequence of steps other features also are patterned on the chip. Then, upon completion of the patterning (and, typically, etching) steps, the structure of each guard ring presents a more uniform barrier, or pertubation, around a respective internal area.

Thereafter, at a desired step in the process, the formation of the devices within the guard ring is begun. In other instances, a prior level that forms part of the structure of these devices already has been layered. In such instances, fabrication continues with a more uniform photoresist layer within the guard ring, which provides for more uniform linewidth thicknesses for the next fabrication operation.

For instance, not to be limiting, a layering operation is followed by patterning to complete an array of two interdigitated resistor devices in a common centroid layout. Further, these and/or other steps may be used to make conducting connections (such as, but not limited to, by means of trenches) between the resistor devices inside the guard ring and other features outside the guard ring. Alternatively for any interconnection, the guard ring may be penetrated (i.e., etched through) or, more typically, the trench or other connection may be at a level above the top of the guard ring. Alternatively, doped junctions formed beneath the guard ring may be employed.

More generally, although a guard ring of the present invention may ultimately have a role in conduction, the main purpose of the guard ring during the methods of the present invention is to provide a barrier to present a more uniform perturbation for the flowing photoresist (compared to varying and diverse nearby underlying structures), resulting in more uniform photoresist thickness within the guard ring.

In other embodiments, a guard ring of the present invention may be formed of an array of devices, such as transistors, resistors, capacitors, and diodes, spaced at determined intervals around an area so as to exert a leveling effect on the photoresist thickness based on the footprint, spacing and height of the members of this array. In such embodiments, any gaps between the array of devices that form the guard ring have Insubstantial effect on photoresist thickness.

As an alternative to forming the guard ring as described above, a guard ring may be formed with a conducting layer, such as a metal, as by deposition processes such as evaporation and sputtering. Also, although rectangular and square are shapes of guard ring generally utilized, other shapes may be employed and are within the scope of the invention.

Thus, generally, a method of the present invention may be summarized by the following steps:

a. Forming a leveling guard ring around a first specified area. This typically is done during the formation of features on other devices across the surface of the wafer during a particular fabrication step, and may include the formation of multiple leveling guard rings at one time. For example, not to be limiting, this forming may be achieved by deposition and related steps as are practiced in the art. As noted, the guard ring may be formed of more than one layer.

b. Applying photoresist over the wafer. Spin coating is the typical manner of applying photoresist, although any means now or later known in the art may be used.

Further, an additional step for certain embodiments is using the photoresist applied within the area(s) formed by one or more leveling guard rings so formed, forming a feature or connection in one or more such area(s) for respective array(s) each comprising two or more devices in a common centroid pattern.

Also, it is noted that a preliminary step comprised of determining an appropriate location for one or more guard rings on a chip may be included in the method. That is, one step in certain embodiments is designing an arrangement of features, including matched adjacent features within one or more specified areas. For each specified area (by which is meant the area of the wafer surface within a planned leveling guard ring), the designing of the arrangement may include designing sufficient space for an arrangement of two or more matched features in a common centroid pattern. Further, in certain embodiments the location of the guard ring is determined based on analysis of elevations (existing or calculated) of features local to where the guard ring is to go. For example, without being limiting, if the arrangement of features local to a specified area were considered to tend to create a multiple perturbations affecting photoresist thickness, the width or the height of the guard ring walls could be designed to better mask this, and/or the guard ring and its contents could be positioned farther away from such features.

Figure 4:
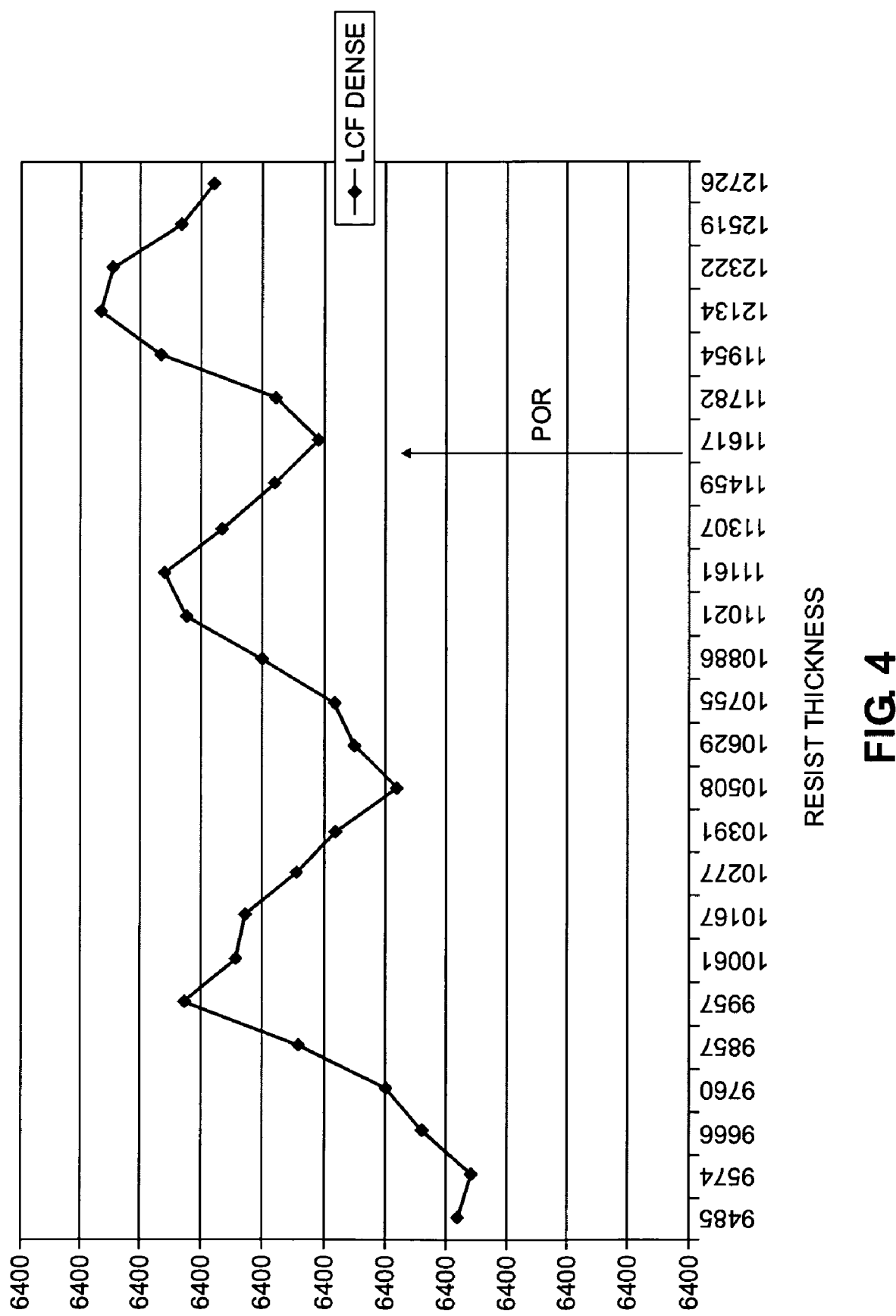
FIG. 4 is a swing curve graph that shows an oscillating relationship for linewidth as photoresist thickness increases.

FIG. 4 is a swing curve graph that shows an oscillating relationship for linewidth as photoresist thickness increases. The data is derived from spin coating entire wafers that are perfectly flat with a variety of photoresist thicknesses, and then printing lines with the same nominal line width. This data is provided to demonstrate one of the deleterious effects on photoresist thickness variation. The photoresist thickness is plotted along the x-axis, and the linewidth is plotted along the y-axis (in Angstroms). Generally, as photoresist thickness increases the linewidth of trenches formed during the photolithography also increases. This upward trend oscillates due to complex light wave phenomena during the photolithography, such as cancellation and reinforcement (i.e., support). Taking this source of deviation into consideration, the worst-case increase in linewidth as photoresist thickness increases is about a 100-nanometer linewidth change over a 65-nanometer change in thickness in this example. Thus, it can be appreciated that the long-range variation in thickness, as can occur in a wafer when photoresist is applied by spin coating, in combination with influences of local underlying features on more local photoresist thickness profiles, can lead to substantial variations in linewidth thicknesses. This in turn leads to device mis-match.

This occurs even if the oscillations were damped by employing an anti-reflective coating, as the rising trend is still present. This is related to the dilution of the exposure dose in the thicker resist.

The present method reduces linewidth thickness variations and other deviations for devices formed within the boundaries of the guard rings of the present invention. This is accomplished in part by imposing a boundary, in the form of a guard ring, around the specified area to reduce or eliminate photoresist thickness-related deviations for features in a device array within that area. At a minimum, this is achieved at a local level for devices within each guard ring. When considering a plurality of guard rings spread across a chip, the devices within these also are more uniform due to lower variation in photoresist thickness (from the guard ring's imposed photoresist flow equalization) and, in certain embodiments, due to the common centroid arrangement within the guard rings. This improves global matching.

Figure 5:
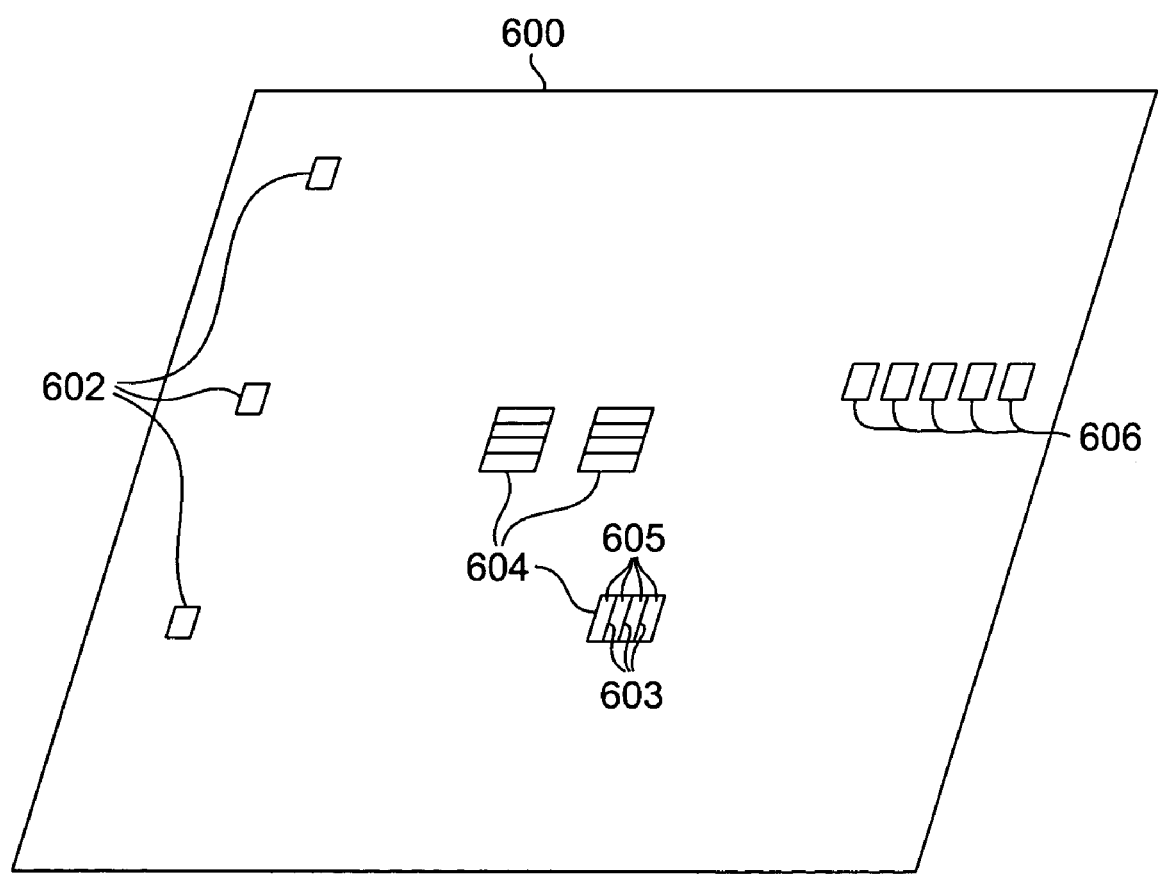
FIG. 5 provides a perspective view generally depicting the locations of a plurality of guard rings across a wafer surface, where other features of the wafer surface are not shown.

FIG. 5 diagrammatically depicts the locations of a plurality of guard rings of a silicon chip 600. This figure is not to scale, and for simplicity, other features of the chip are not shown, including the devices internal to these guard rings. Various configurations of leveling guard rings are depicted, some with common walls (i.e., a wall between two adjacent areas surrounded by guard rings). Three isolated guard rings 602 each are spaced sufficiently far apart to not be influenced by the local features affecting another one of these isolated guard rings. Each of the three guard ring assemblies 604 are comprised of four guard rings 605 sharing three common walls 603. In contrast, guard rings 606 are local to one another and do not share any common walls. When the present invention is utilized across the entire surface of a chip, each local deviation due to photoresist height, such as due to the influence of local topographic elevation, is reduced for the respective devices arrayed within the guard rings. When these devices are matched with other devices in other, non-local guard ring areas, there is reduced performance disparity based on the improved feature uniformity (owing to more uniform photoresist thickness) in combination with the common centroid layouts. Consequently, as discussed above, improved global matching is achieved.

It is noted that while embodiments described herein comprise matched devices within a guard ring that are arranged in a common centroid layout, other embodiments of the present invention comprise a guard ring within which are arranged one or more devices that are not arranged in a common centroid layout.

The present invention increases the accuracy, precision, and predictability of linewidths of features formed during photolithography. Without a guard ring such as disclosed herein, the variation in photoresist thickness is unpredictable due to combination of effects from local dense and/or elevated underlying features.

While the preferred embodiments of the present invention have been shown and described herein in the present context, such embodiments are provided by way of example only, and not of limitation. Numerous variations, changes and substitutions will occur to those of skilled in the art without departing from the invention herein. For example, the present invention need not be limited to best mode disclosed herein, since other applications can equally benefit from the teachings of the present invention. Accordingly, it is intended that the invention be limited only by the spirit and scope of the appended claims.

What is claimed is:

1. During fabrication of an integrated circuit on a semiconductor wafer, a method for reducing photoresist thickness variation within an enclosed area of a patterned circuit on the wafer comprising the steps of:
   a. forming adjacent leveling guard rings enclosing the enclosed area, the guard rings sharing at least one common wall;
   b. applying photoresist over the wafer; and
   c. imaging the photoresist layer to define features within the enclosed area.

2. The method of claim 1 additionally comprising fabricating within at least one of the guard rings two or more devices in a common centroid pattern.

3. The method of claim 1, additionally comprising designing the integrated circuit to comprise a plurality of enclosed areas globally spaced across the integrated circuit.

* * * * *